US012604407B2

(12) United States Patent   (10) Patent No.: US 12,604,407 B2
Makhlay   (45) Date of Patent: Apr. 14, 2026

(54) SECURELY LINKED NEAR FIELD COMMUNICATION DEVICE

(71) Applicant: Timofey Makhlay, Marina Del Ray, CA (US)

(72) Inventor: Timofey Makhlay, Marina Del Ray, CA (US)

( * ) Notice: Subject to any disclaimer, the term of this patent is extended or adjusted under 35 U.S.C. 154(b) by 218 days.

(21) Appl. No.: 18/656,279

(22) Filed: May 6, 2024

(65) Prior Publication Data

US 2025/0344320 A1      Nov. 6, 2025

(51) Int. Cl.
   *H05K 1/16*       (2006.01)
   *H05K 1/02*       (2006.01)
   *H05K 1/11*       (2006.01)

(52) U.S. Cl.
   CPC ............... *H05K 1/16* (2013.01); *H05K 1/028* (2013.01); *H05K 1/115* (2013.01); *H05K 1/118* (2013.01); *H05K 2201/10098* (2013.01)

(58) Field of Classification Search
   None
   See application file for complete search history.

(56) References Cited

U.S. PATENT DOCUMENTS

| | | | |
|---|---|---|---|
| 8,238,825 B2 | 8/2012 | Rofougaran | |
| 8,520,396 B2 * | 8/2013 | Schmidt | .............. H01L 25/0657 |
| | | | 361/746 |
| 9,002,268 B2 | 4/2015 | Desclos | |
| 10,636,563 B2 | 4/2020 | Peralta | |

| | | | |
|---|---|---|---|
| 11,690,179 B2 * | 6/2023 | Park | .................... H04M 1/0277 |
| | | | 174/262 |
| 2012/0299785 A1 * | 11/2012 | Bevelacqua | ........... H01Q 13/10 |
| | | | 343/702 |
| 2014/0015719 A1 | 1/2014 | Ramachandran | |
| 2014/0139380 A1 * | 5/2014 | Ouyang | ................. H01Q 5/314 |
| | | | 343/702 |
| 2015/0189760 A1 * | 7/2015 | Ho | ......................... H05K 1/165 |
| | | | 174/251 |

(Continued)

FOREIGN PATENT DOCUMENTS

| | | | | |
|---|---|---|---|---|
| JP | 2006127424 A | 5/2006 | | |
| KR | 20210024802 A | 3/2021 | | |
| WO | WO-2016172444 A1 * | 10/2016 | .............. | H02J 50/20 |

OTHER PUBLICATIONS

Near-field and far-field shared, Meng-Shuang Wang, IET Journals. Planar Shared Antenna Structure, Meng-Shuang Wang, IEEE Transactions.

*Primary Examiner* — Krystal Robinson
(74) *Attorney, Agent, or Firm* — Judd M. Patton, Esq.

(57) ABSTRACT

Descripted herein may be a securely linked NFC device which may include a printed circuit board which may have a single NFC antenna and a plurality of individually selectable NFC chips designed for end user needs. Each NFC chip may be selected by use of a mechanical switch which may use non-metallic contacts that temporarily activates a single NFC chip at a time while leaving all other NFC chips deactivated. Said activation may occur by selectively closing a circuit on Printed Computer Board and using a variable circuit trace geometry to select electrically conductive paths which maintain impedance balance. This securely linked NFC device may enhance security of NFC uses because all NFC chips remain in a deactivated state until selected via mechanical selector from the end user.

19 Claims, 10 Drawing Sheets

(56) References Cited

U.S. PATENT DOCUMENTS

| 2016/0037625 A1* | 2/2016 | Huitema | .............. | H05K 1/0281 |
| | | | | 361/749 |
| 2016/0112219 A1* | 4/2016 | Lee | .......................... | H04B 5/43 |
| | | | | 455/77 |
| 2016/0142866 A1* | 5/2016 | Jang | ........................ | H02J 50/12 |
| | | | | 455/41.1 |
| 2016/0165728 A1* | 6/2016 | Fullam | ................. | H05K 1/0253 |
| | | | | 174/268 |
| 2021/0064952 A1* | 3/2021 | Yang | ................. | G06K 19/0716 |

* cited by examiner

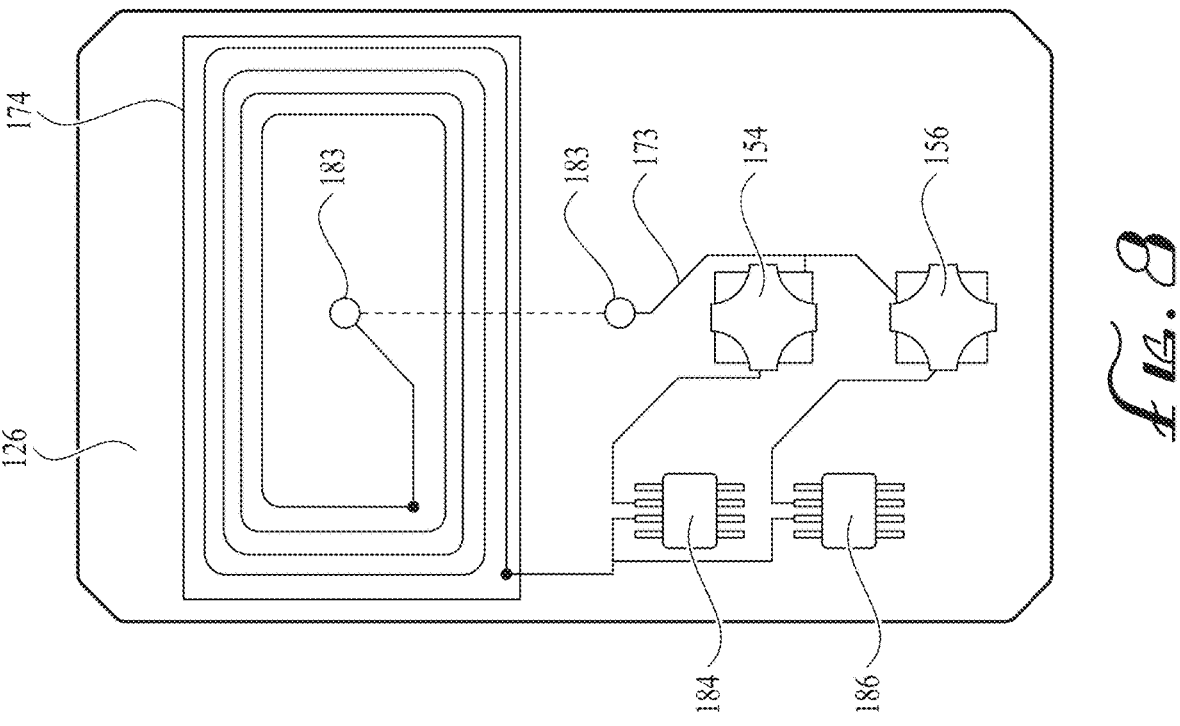
_Fig. 8_
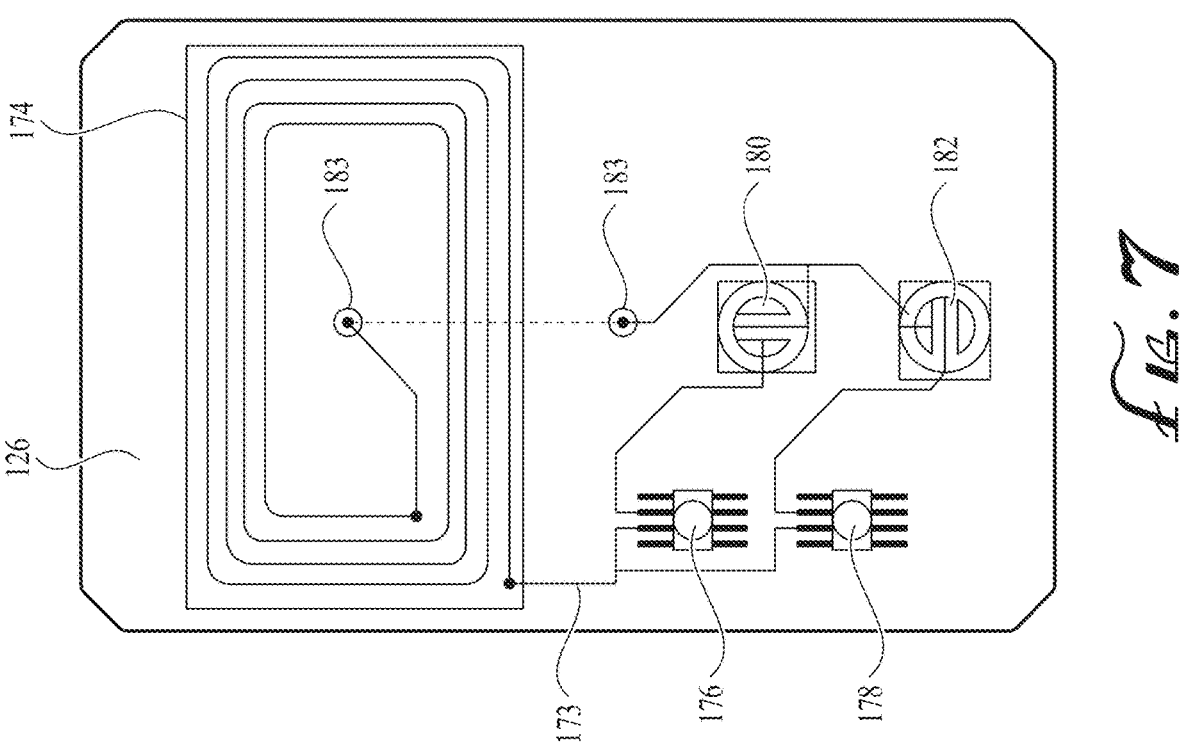
_Fig. 7_

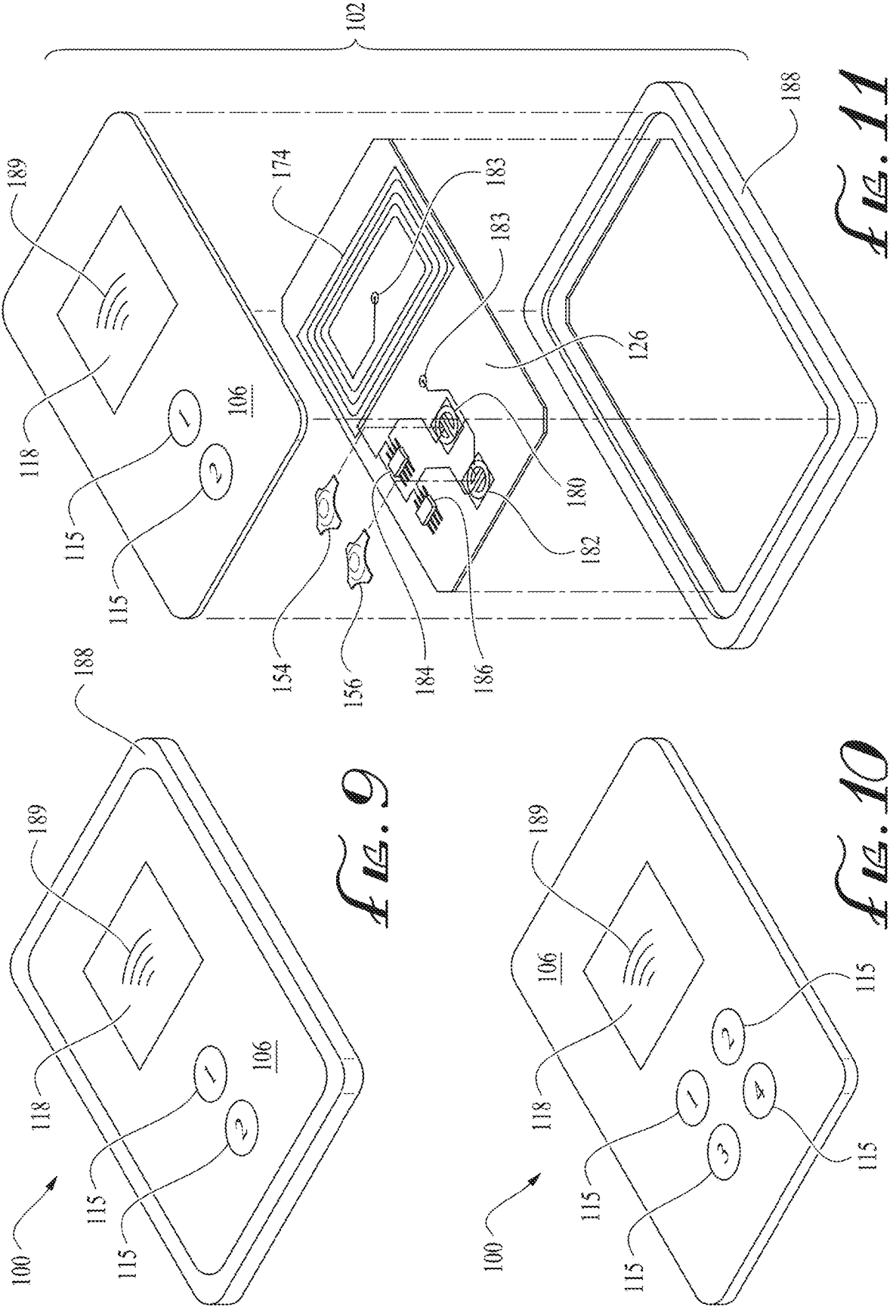

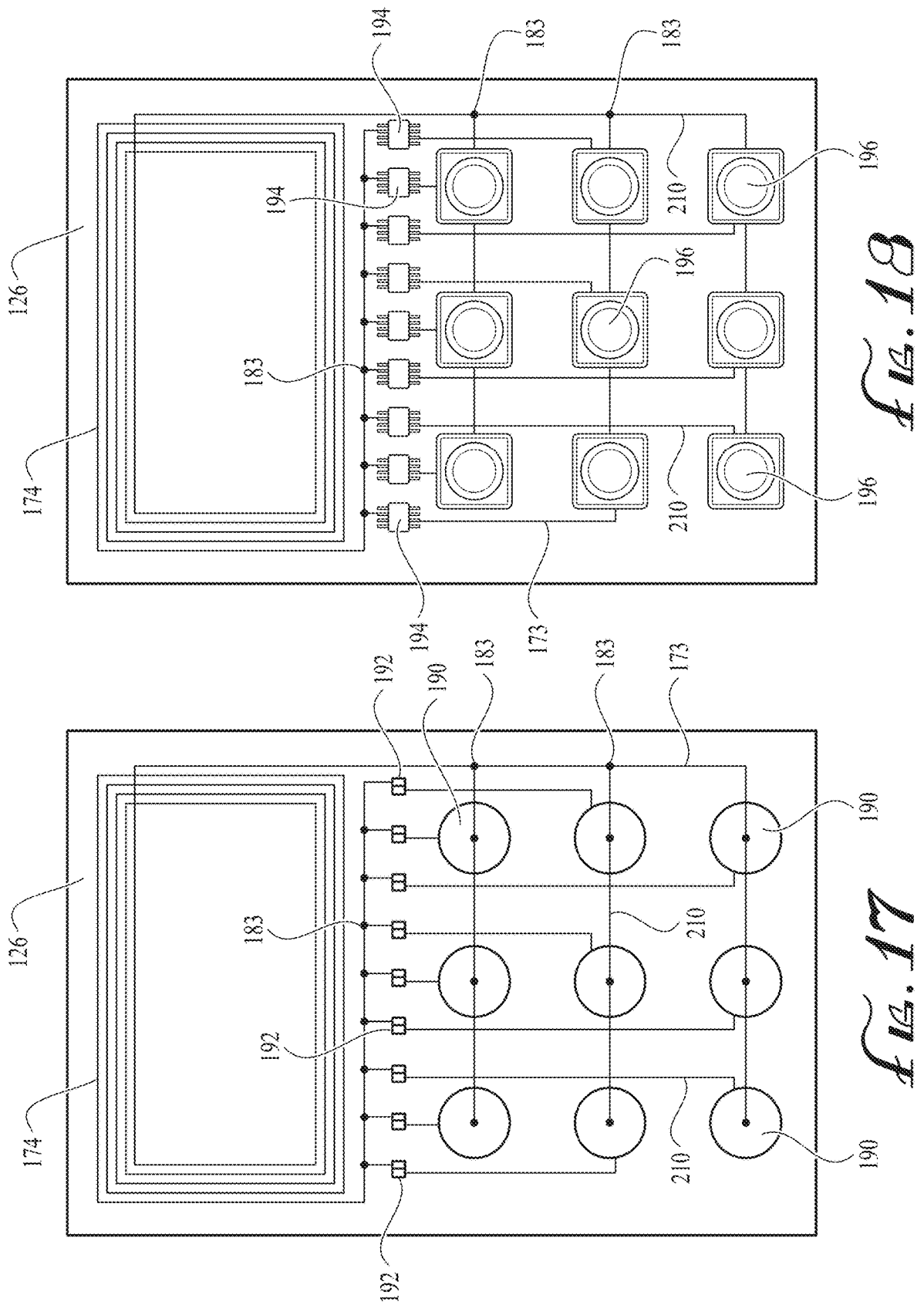

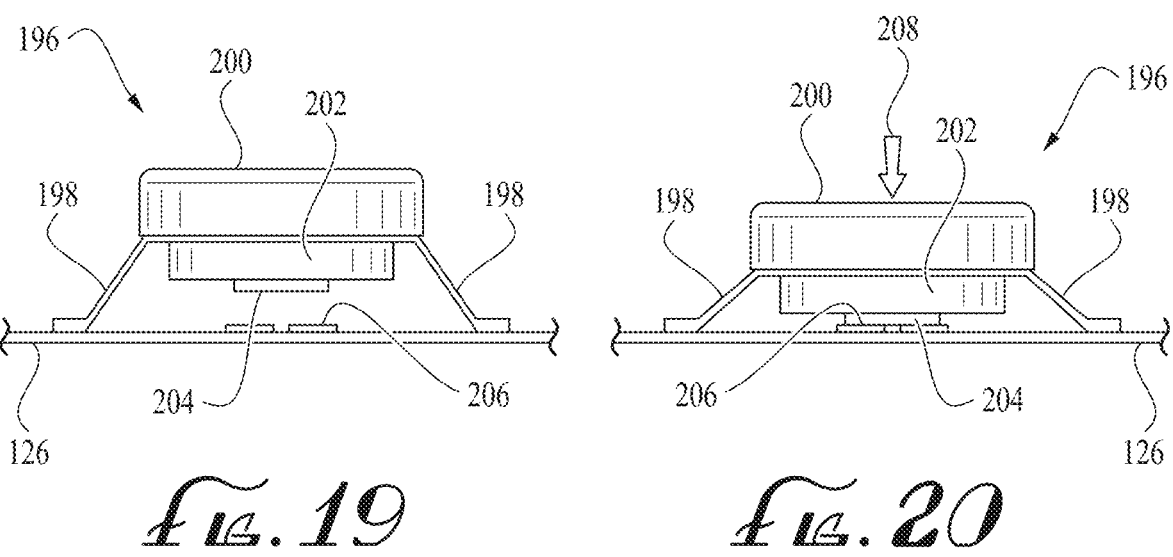
*fig.19*        *fig.20*
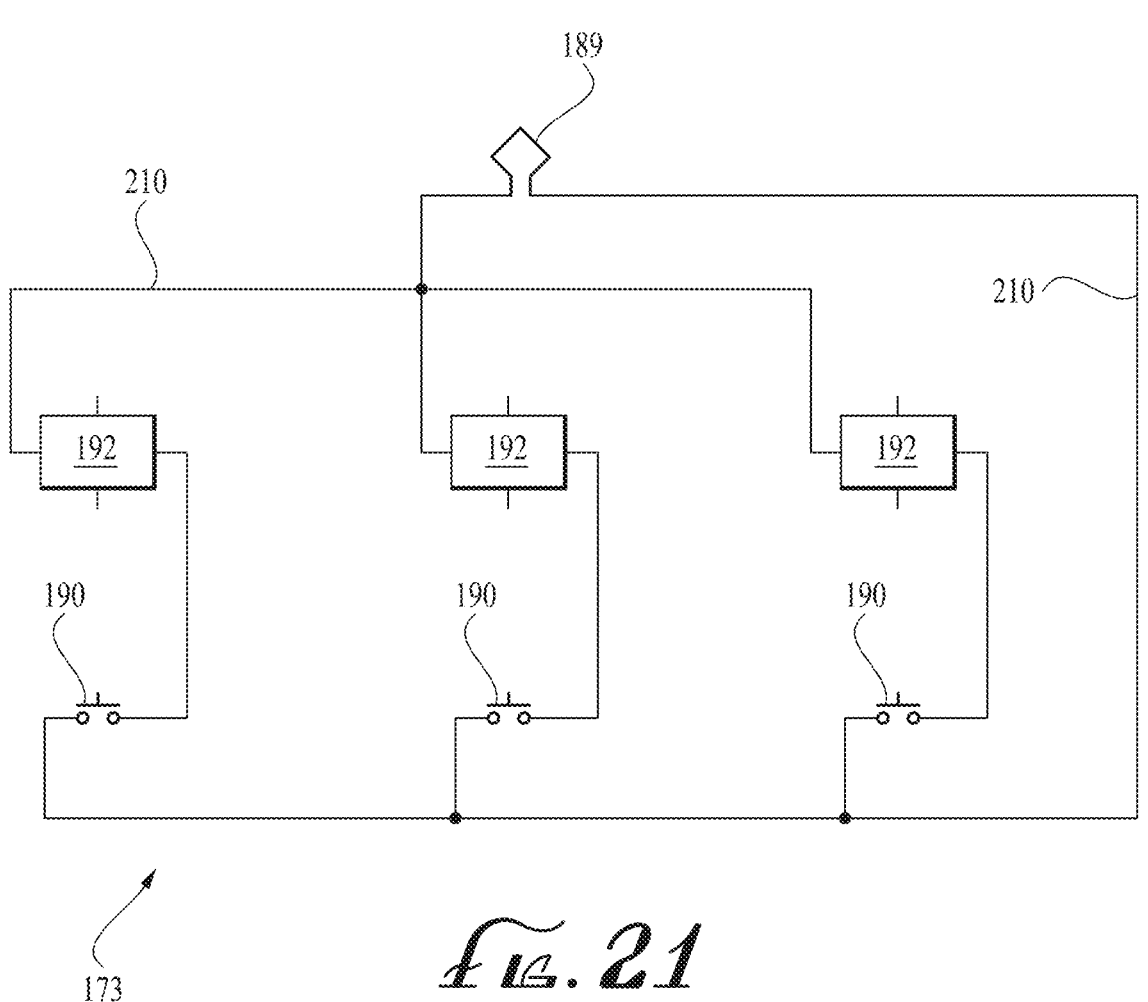
*fig.21*

SECURELY LINKED NEAR FIELD COMMUNICATION DEVICE

RELATED APPLICATIONS

No related applications.

TECHNICAL FIELD

The disclosure herein relates broadly to devices and methods for a novel use of Near Field Communication ("NFC") chips. Speaking generally, this disclosure relates to the deployment of one or more than one NFC frequencies via unpowered antenna. More particularly, the disclosure relates to devices and methods to facilitate the use of various NFC frequencies on one device, utilizing only one antenna while not requiring an internal power source.

BACKGROUND

NFC technology presents numerous risks; non-exhaustive examples include eavesdropping, relay attack, cloning, and skimming. Further, NFC chips are produced with an incorporated design wherein a single antenna is generally used per NFC chip without the ability to cycle various NFC chips using the antenna. Additionally, many NFC chips require external power sources and maintain themselves in an "always ready" or "active" state, have interlocking or moving parts, or are otherwise prone to failure. What is needed is an NFC technology which addresses the above issues.

SUMMARY

Certain deficiencies of the prior art are overcome by the provision of embodiments of an apparatus, kit, and system in accordance with the present disclosure. A securely linked NFC device which may comprise an interface cover and a printed circuit board. The interface cover may further have a user input point and an interface screen. The printed circuit board may have a PCB circuit trace, an NFC antenna, a circuit vias, a user input location, and a deformable selector. The deformable selector may be conductive and may close a circuit. The securely linked NFC device may further comprise an NFC insertion location which may have an NFC chip which may be powered passively and may be re-writable. The NFC chip and the NFC insertion location may be disposed to any location on the printed circuit board provided that the specific location is not occupied by other components.

Other descriptions of the NFC device may include a printed circuit board which may have a single NFC antenna, a circuit vias, a PCB circuit trace, an NFC insertion location, and a more than one user input location. Each of the NFC insertion locations may be configured to receive a respective single NFC chip and each of the user input locations may be configured to receive a respective single deformable selector. Additionally, each of the respective single deformable selectors may be mechanically deformable between an engaged configuration and a disengaged configuration. Further, the engaged configuration may aid in establishing electrical continuity between the single NFC antenna and the respective single NFC chip therein. Further, the engaged configuration may be passively activating the respective single NFC chip to an exclusion of all other of the respective single NFC chip then in the disengaged configuration.

BRIEF DESCRIPTION OF THE DRAWINGS

The foregoing and other features of the present disclosure will become more fully apparent from the following description, taken in conjunction with the accompanying drawings. Understanding that these drawings depict only several embodiments in accordance with the disclosure and are not to be considered limiting of its scope, the disclosure will be described with additional specificity and detail using accompanying drawings. Accordingly, further advantages of the present disclosure may become apparent to those skilled in the art with the benefit of the following description of the embodiments and upon reference to the accompanying drawings in which:

FIG. 7 is a plan view of an alternative embodiment of a printed circuit board of the securely linked NFC device showing an alternative circuit trace;

FIG. 8 is a plan view of an alternative embodiment of a printed circuit board of the securely linked NFC device showing components placed in the printed circuit board;

FIG. 9 is a perspective view of one embodiment of the securely linked NFC device which may support one or more than one NFC chips;

FIG. 10 is a perspective view of one embodiment of the securely linked NFC device which may support one or more than one NFC chips;

FIG. 11 is an exploded perspective view of one non-limiting embodiment of the securely linked NFC device which illustrates an alternative embodiment of the stacked design of the securely linked NFC device;

FIG. 17 is a plan view of an alternative embodiment of a printed circuit board of the securely linked NFC device showing an alternative embodiment of the circuit trace;

FIG. 18 is a plan view of an alternative embodiment of a printed circuit board of the securely linked NFC device showing components placed in the printed circuit board;

FIG. 19 is a side view of one embodiment of a deformable selector of the securely linked NFC device;

FIG. 20 is a side view of one embodiment of a deformable selector of the securely linked NFC device wherein the deformable selector is in an engaged configuration; and, FIG. 21 is a diagram view of one alternative embodiment of a circuit trace with antenna and NFC chips showing impedance balance of the securely linked NFC device.

DESCRIPTION OF THE VARIOUS EMBODIMENTS

Figure 1:
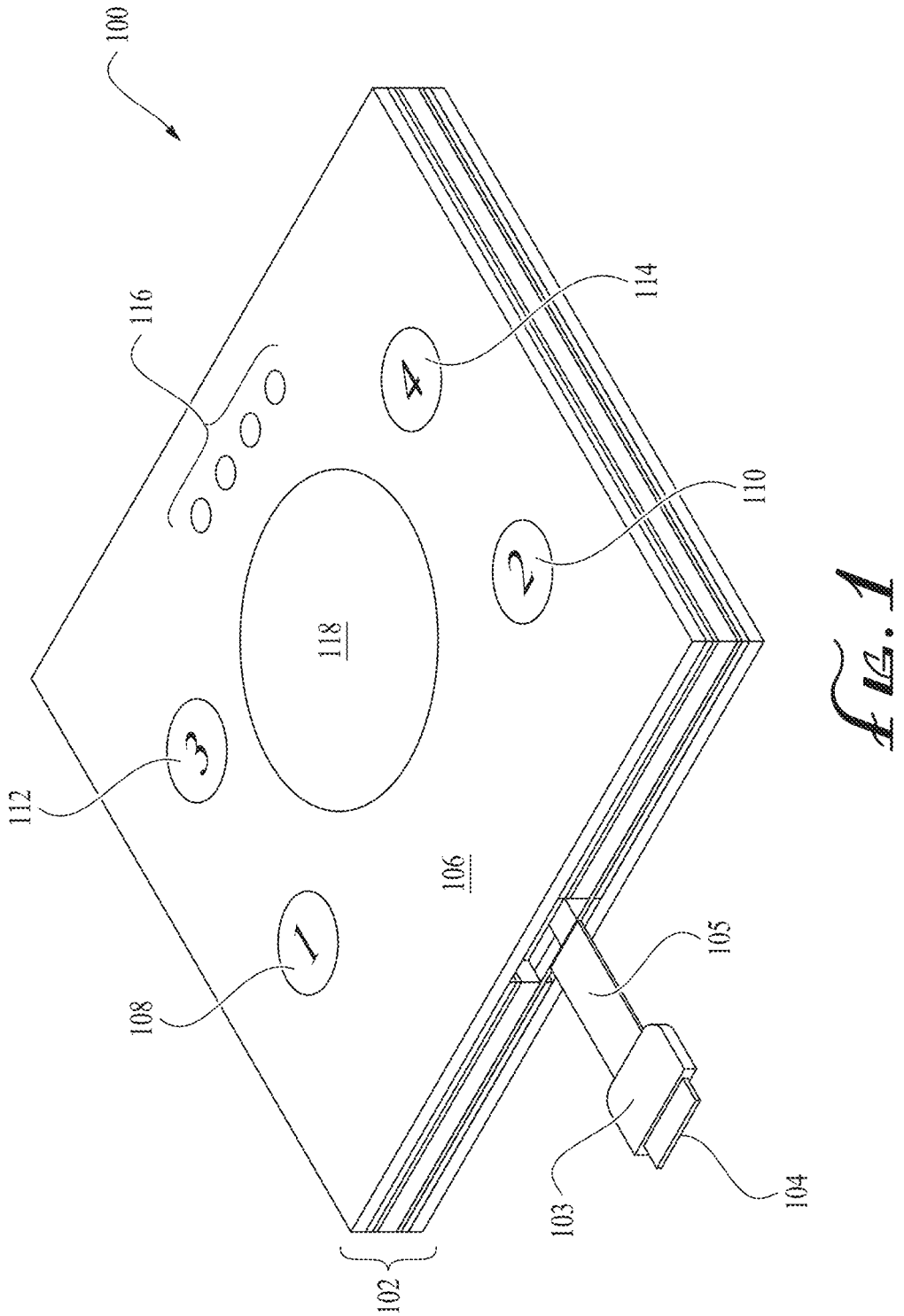
FIG. 1 is a perspective view in accordance with one non-limiting embodiment of a securely linked NFC device.

Embodiments of systems, components, and methods of assembly and manufacture will now be described with reference to the accompanying figures. Although several embodiments, examples, and illustrations are disclosed below, it will be understood by those of ordinary skill in the art that the embodiments described herein extend beyond the specifically disclosed configurations, examples, and illustrations, and can include other users of the disclosure and obvious modifications and equivalents thereof. The terminology used in the descriptions presented herein is not intended to be interpreted in any limited or restrictive manner simply because it is being used in conjunction with a description of certain specific embodiments of the disclosure. In addition, embodiments of the disclosure can comprise several novel features and no single feature is solely responsible for its desirable attributes or is essential to practicing any one of the several embodiments herein described.

Certain terminology may be used in the following description for the purpose of reference only, and thus are not intended to be limiting. For example, terms such as "above" and "below" refer to directions in the drawings to which reference is made. Terms such as "front," "back," "left," "right," "rear," "top," "bottom" and "side" describe the orientation and/or location of portions of the components or elements within a consistent but arbitrary frame of reference which is made clear by reference to the text and the associated drawings describing the components or elements under discussion. Moreover, terms such as "first," "second," "third," and so on may be used to describe separate components and do not necessarily imply and order in time or space unless so stated. Such terminology may include the words specially mentioned above, derivatives thereof, and words of similar import.

Referring to the drawings, like reference numerals designate identical or corresponding features throughout the several views. Described herein are certain non-limiting embodiments of a securely linked NFC device 100 for use in the application and support of smart home features, smart utility features, smart appliance features, smart wallet features, smart entryway features, and all other associated functions of NFC chips and frequencies therein.

Referring to FIG. 1, shown is a securely linked NFC device 100. Seen is a membrane stack 102, wherein multiple layers may be stacked upon each other to build up the functional securely linked NFC device 100. Further seen may be a connector pin housing 103, a PCB connector pinout 104, and a PCB cable connection 105. The connector pin housing 103, the PCB connector pinout 104, and the PCB cable connection 105 may provide a connection path to input digital information onto the securely linked NFC device 100. The securely linked NFC device 100 may be contemplated for wireless configuration, and thus the connector pin housing 103, the PCB connector pinout 104, and PCB cable connection 105 may be optional. Further seen is an interface cover 106, a first user input point 108, a second user input point 110, a third user input point 112, a fourth user input point 114, a power indicator lights 116, and an interface screen 118. The first user input point 108, the second user input point 110, the third user input point 112, and the fourth user input point 114, along with any other user input point, may together be collectively referred to as a user input point 115. The interface cover 106 may provide the necessary support for use of the first user input point 108, the second user input point 110, the third user input point 112, and the fourth user input point 114, in addition to the power indicator lights 116 and the interface screen 118.

Still referring to FIG. 1, the first user input point 108, the second user input point 110, the third user input point 112, and the fourth user input point 114, (or collectively as user input point 115 as seen in FIGS. 9-11) may occur in greater numbers or fewer numbers. Importantly, there is no specific number of user input point 115 (as seen in FIG. 9) considered in this disclosure, rather this disclosure contemplates that this securely linked NFC device 100 can utilize as many user input points 115, with associated components for functionality, as may be needed for end user needs. In parallel fashion, this also means that securely linked NFC device 100 may utilize as many NFC chips as is needed for a given set of usage parameters for the securely linked NFC device 100 as set and determined by end user needs.

Figure 2:
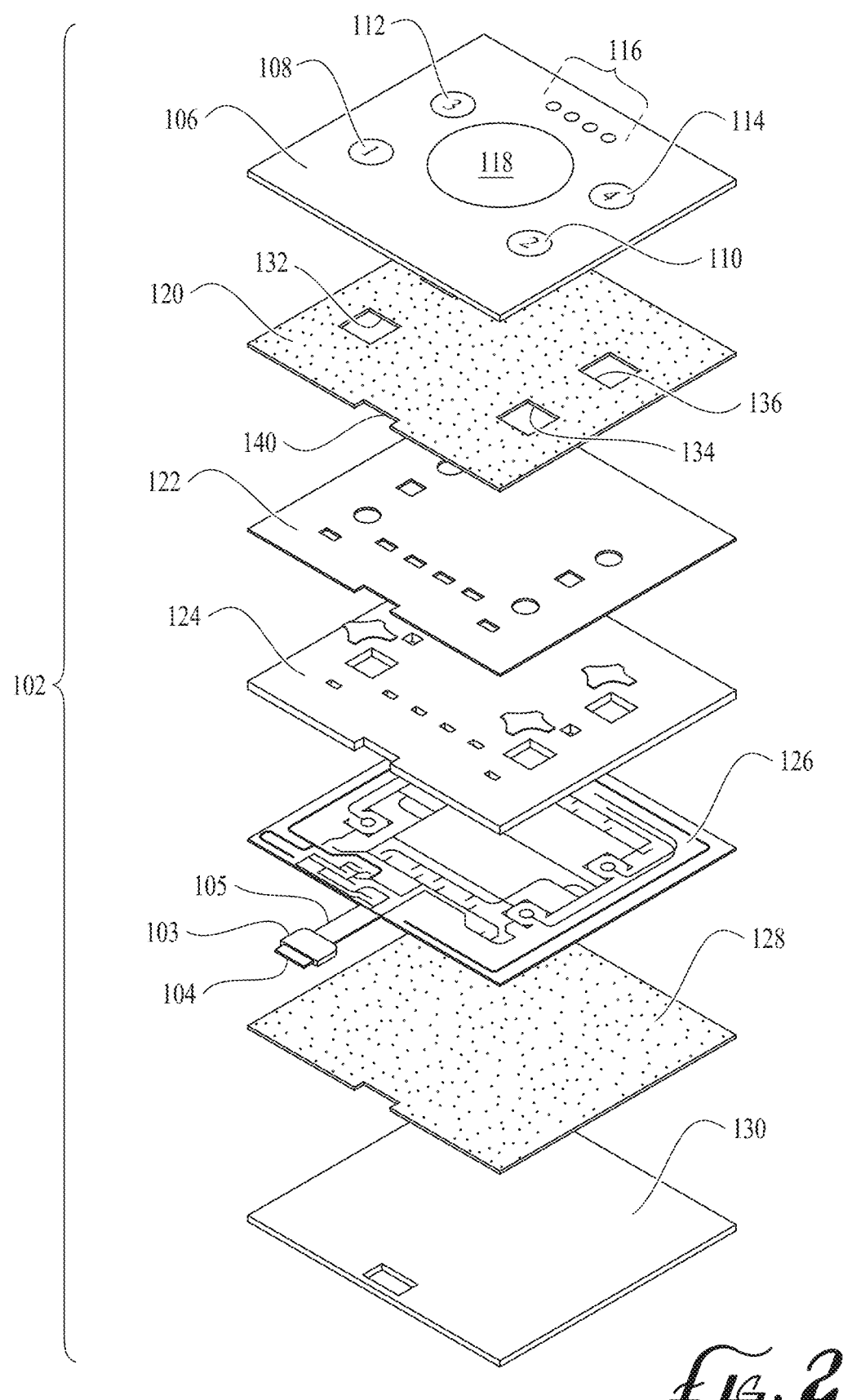
FIG. 2 is an exploded perspective view of one non-limiting embodiment of a securely linked NFC device which illustrates a stacked design.

Now referring to FIG. 2, seen is an exploded perspective view which shows the full membrane stack 102, each portion of the membrane stack 102 herein are identified in no specific order, the portions being the interface cover 106, an adhesive layer 120, a tactile layer 122, a spacing layer 124, a printed circuit board 126, an adhesive plate 128, and a bottom plate 130. Not all layers are required for full functionality of the securely linked NFC device 100. The said components may be placed adjacent to each other such that a unitary flat shape may be obtained. This printed circuit board 126 shown herein in FIG. 2 is for discussion only, the actual components and layout of the printed circuit board 126 may vary from those shown in FIGS. 2, 6-8, 11, and 17-18. All adhesive layers may alternatively be applied to one side, or an opposite side, of each of the interface screen 118, tactile layer 122, spacing layer 124, or bottom plate 130, such that one plate may adhere to the next via an application of an adhesive to said one side or opposite side. The spacing layer 124 and bottom plate 130 may be optional, and use may be dependent on structural needs of any given iteration of the securely linked NFC device 100.

Figure 3:
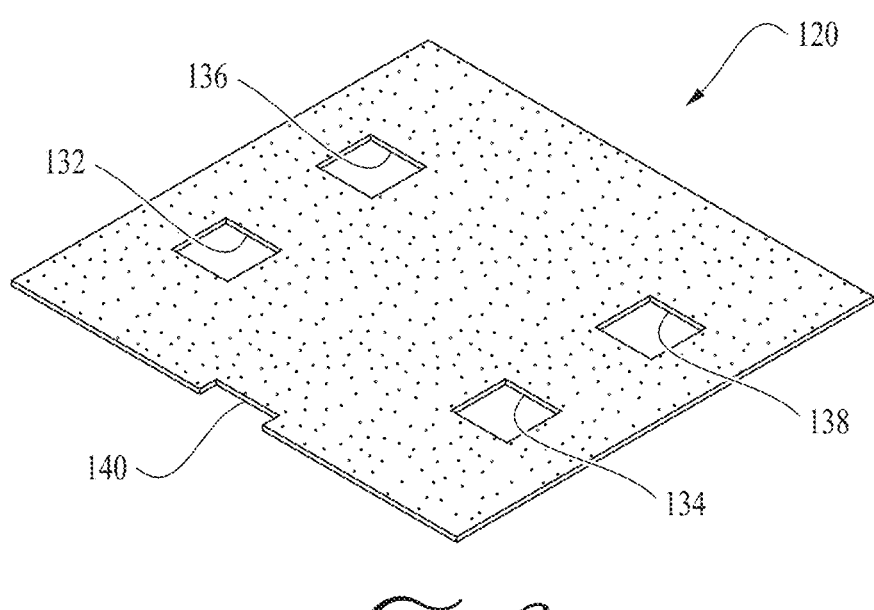
FIG. 3 is a perspective view of an adhesive layer of the securely linked NFC device.

Now referring to FIG. 3, shown is the adhesive layer 120. Said apertures may include a first adhesive layer aperture 132, a second adhesive layer aperture 134, a third adhesive layer aperture 136, or a fourth adhesive layer aperture 138. Said apertures may occur in additional locations across the adhesive layer 120 in other embodiments. The adhesive layer 120 may include more than the presently disclosed apertures and may place apertures in different locations or of different size than seen herein. Additionally seen in FIG. 3 is a first relief notch 140. The first relief notch 140 may provide a path for the PCB cable connection 105 to freely move about as may be required through normal use. The first relief notch 140 may not be required in all iterations of the securely linked NFC device 100.

Figure 4:
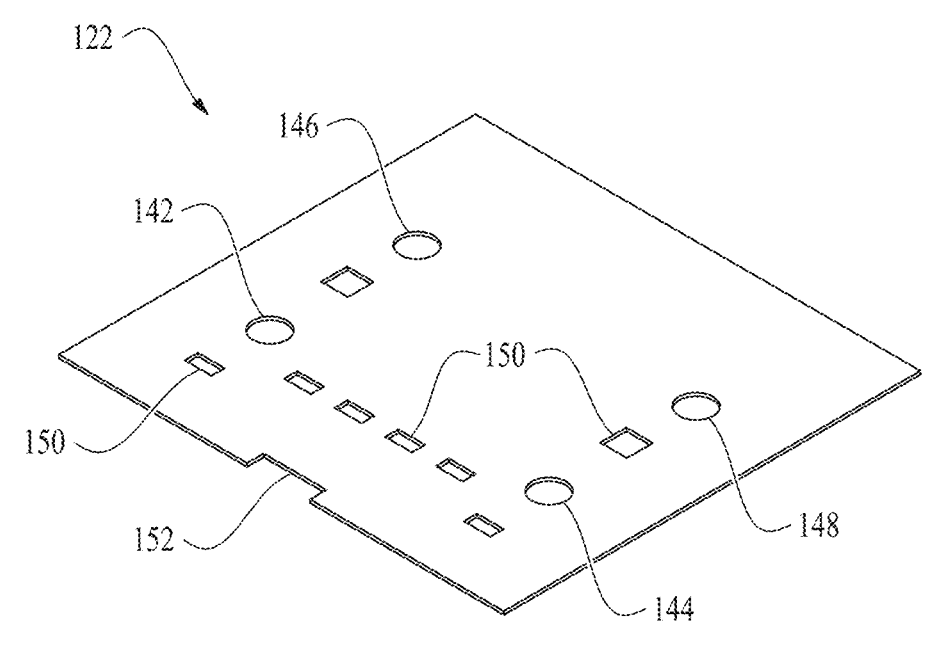
FIG. 4 is a perspective view of a tactile layer of the securely linked NFC device.

Now referring to FIG. 4, seen is the tactile layer 122. Seen on tactile layer 122 is a first deformable selector alignment aperture 142, a second deformable selector alignment aperture 144, a third deformable selector alignment aperture 146, a fourth deformable selector alignment aperture 148, and an alignment depression 150. Said alignment depression 150 can be seen over the surface of the tactile layer 122 and may be placed at any location on the tactile layer 122. Additionally, the first deformable selector alignment aperture 142, second deformable selector alignment aperture 144, third deformable selector alignment aperture 146, and the fourth deformable selector alignment aperture 148 may be located at any point on the tactile layer 122. Additionally seen is a second relief notch 152. The second relief notch 152 may provide a path for the PCB cable connection 105 to freely move about as may be required through normal use. The second relief notch 152 may be optional in some iterations of the securely linked NFC device 100. The tactile layer 122 and all associated features may be optional in some iterations of the securely linked NFC device 100.

Figure 5:
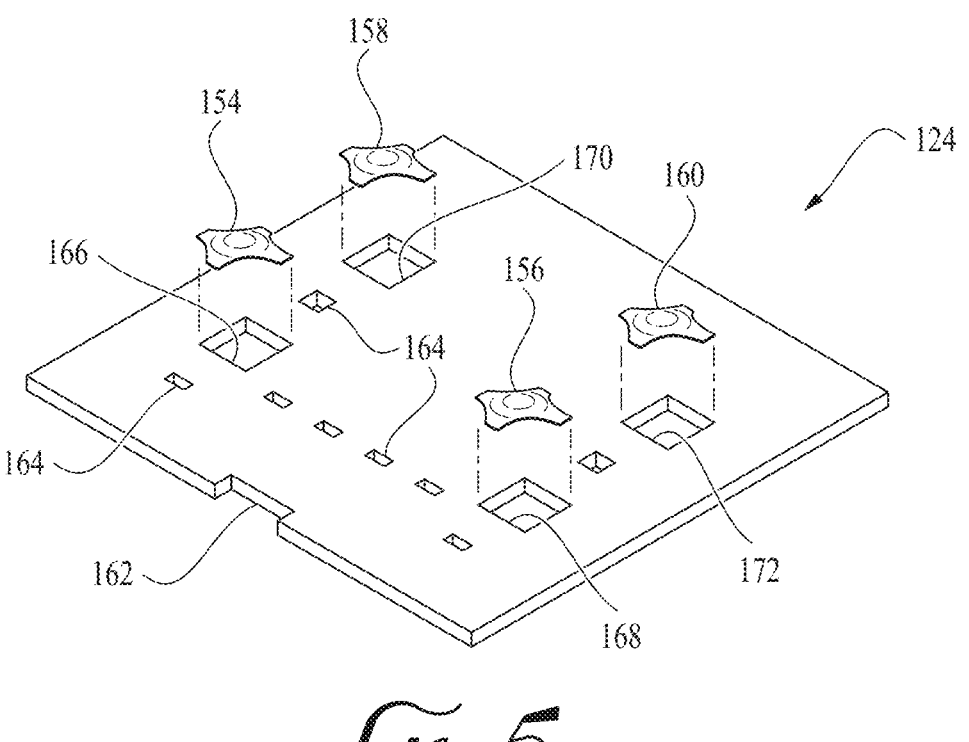
FIG. 5 is a perspective view of a spacing layer of the securely linked NFC device with further view of components.

Now referring to FIG. 5, seen is the spacing layer 124. Seen associated with the spacing layer 124 is a first deformable selector 154, a second deformable selector 156, a third deformable selector 158, and a fourth deformable selector 160. Further seen is the which may have several apertures. Additionally seen is a third relief notch 162. The third relief notch 162 may provide a path for the PCB cable connection 105 to freely move about as may be required through normal use. The third relief notch 162 may be optional in some iterations of the securely linked NFC device 100. The spacing layer 124 may be optional in some iterations of the securely linked NFC device 100.

Still referring to FIG. 5, further seen are a series of alignment aperture 164. The alignment aperture 164 are seen throughout the spacing layer 124 and may correspond with the alignment depression 150 of the tactile layer 122, as seen in FIG. 4. Said apertures may aid in alignment between the tactile layer 122 and the spacing layer 124. Additionally viewed in FIG. 5 may be a first retention space 166, a second retention space 168, a third retention space 170, and a fourth retention space 172. The first retention space 166, the second retention space 168, the third retention space 170, and the fourth retention space 172 may aid in the retention of the a corresponding first deformable selector 154, second deformable selector 156, third deformable selector 158, and fourth deformable selector 160, which may be deployed to the respective spaces of the first retention space 166, the second retention space 168, the third retention space 170, and the fourth retention space 172. The first deformable selector 154, the second deformable selector 156, the third deformable selector 158, and the fourth deformable selector 160 may provide a user with haptic feedback when used with the first user input point 108, second user input point 110, third user input point 112, and fourth user input point 114.

Now referring to FIGS. 3, 4, and 5, the first deformable selector 154, the second deformable selector 156, the third deformable selector 158, and the fourth deformable selector 160 may be located on the tactile layer 122. Further, first deformable selector 154, second deformable selector 156, third deformable selector 158, and fourth deformable selector 160 may be considered optional features for use when appropriate for a given iteration of the securely linked NFC device 100. Additionally, the first deformable selector alignment aperture 142, the second deformable selector alignment aperture 144, the third deformable selector alignment aperture 146, and the fourth deformable selector alignment aperture 148, may be considered optional features for use when appropriate for a given iteration of the securely linked NFC device 100. The first relief notch 140, the second relief notch 152, and the third relief notch 162 may be optional and included dependent on specific needs of any given iteration of the securely linked NFC device 100. The first retention space 166, the second retention space 168, the third retention space 170, and the fourth retention space 172 may be optional and included dependent on specific needs of any given iteration of the securely linked NFC device 100.

Figure 6:
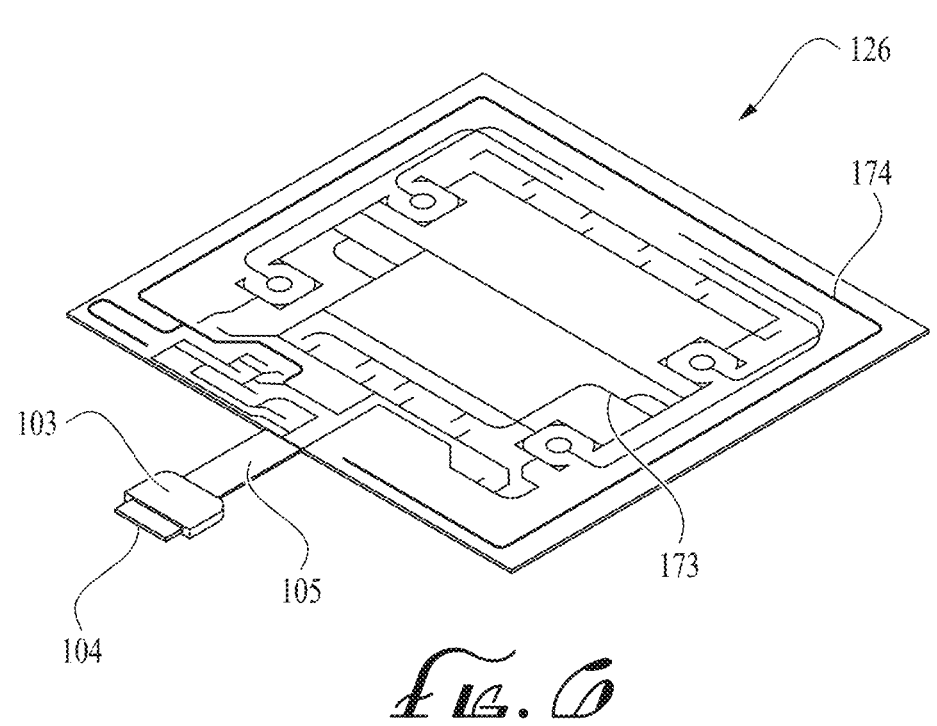
FIG. 6 is a perspective view of a printed circuit board of the securely linked NFC device which may facilitate information transfer of the securely linked NFC device.
Figures 12, 13:
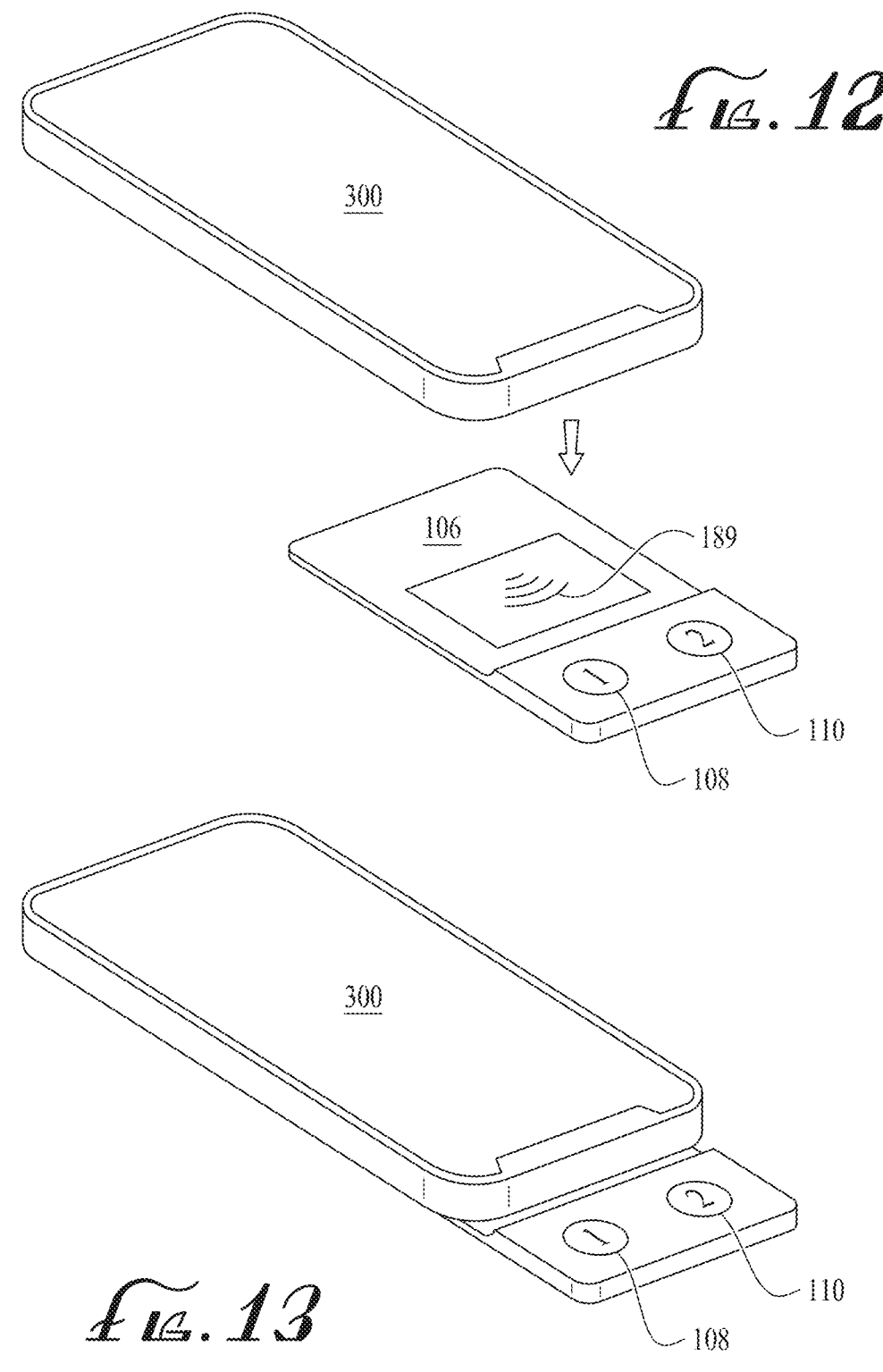
FIG. 12 is a perspective view of one embodiment of the securely linked NFC device which illustrates one potential method of supporting integration with a smartphone.
FIG. 13 is a perspective view of one embodiment of the securely linked NFC device which illustrates one potential integration with a smartphone.
Figures 14, 15, 16:
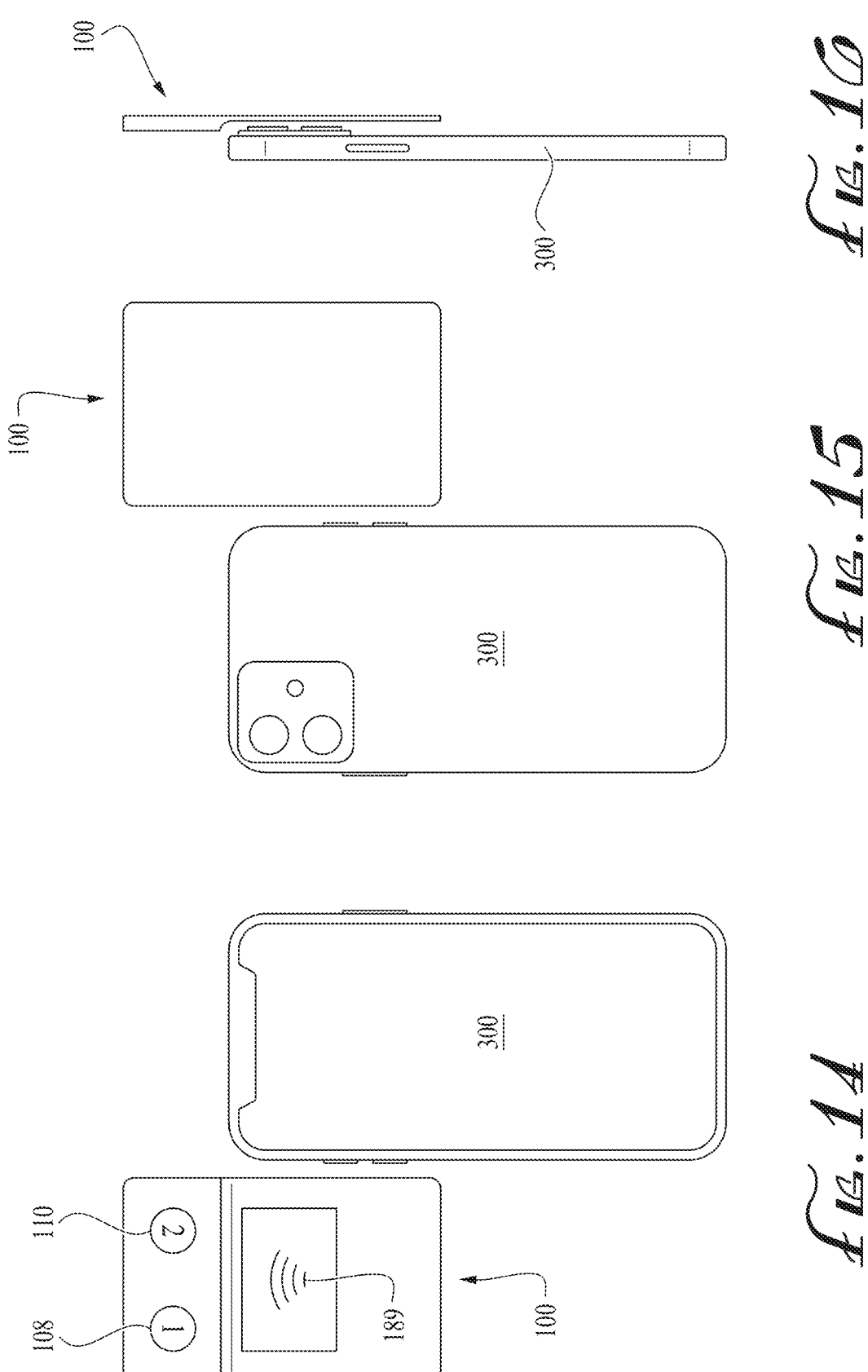
FIG. 14 is a top view of one embodiment of the securely linked NFC device which illustrates one potential integration with a smartphone.
FIG. 15 is a bottom view of one embodiment of the securely linked NFC device which illustrates one potential integration with a smartphone.
FIG. 16 is a profile view of one embodiment of the securely linked NFC device which illustrates one potential integration with a smartphone.

FIGS. 6, 7, and 8 show the printed circuit board 126 with the PCB circuit trace 173. As can be seen, the PCB circuit trace 173 may define the specific locations for some other components. By way of example, the PCB circuit trace 173 of FIG. 7 shows a first NFC location 176 and a second NFC location 178, but an unlimited number of additional NFC locations are contemplated herein, for example as seen FIG. 6. Additionally seen in FIGS. 6, 7, and 8 are NFC antenna 174. FIGS. 7 and 8 show a larger iteration of NFC antenna 174 than FIG. 6, and any shape and size of NFC antenna 174 for the securely linked NFC device 100 is conceived of herein and no illustration can serve to limit the NFC antenna 174 for purposes of this disclosure.

Also seen in FIG. 6 is the connector pin housing 103, the PCB connector pinout 104, and the PCB cable connection 105. Each of the features may be optional for any given iteration of the securely linked NFC device 100.

Referring to FIGS. 7 and 8; seen in the PCB circuit trace 173 may be one or more than one circuit vias 183. Said PCB circuit trace 173 may represent a connection between two or more metal layers, or paths, of the printed circuit board 126 and may consist of a barrel, a pad, or an anti-pad. Said paths of the PCB circuit trace 173 may be connected by way of blind vias, buried vias, circuit vias, and may be formed by use of electroplating, conductive tube, or rivet. Other types of circuit vias may be deployed to securely linked NFC device 100 and the list in no way forms a limitation on said circuit vias 183 design or use.

Further seen in FIG. 8, the printed circuit board 126 shown may be configured for two NFC chips, and thus a corresponding number of user inputs exists. In this iteration, the first user input point 108 and second user input point 110 may be illustrated. Further illustrated in FIG. 8 may be a first NFC chip 184 and second NFC chip 186 located supra with respect to the first NFC location 176 and second NFC location 178, respectively, with further reference seen in FIG. 7 where necessary.

Now referring to FIGS. 9, 10, and 11; seen are other iterations in form only of the present disclosure which may retain the same core elements as seen in prior figures. Seen is FIG. 9 may be an iteration wherein the interface cover 106 may be configured for having a one or more than one user input point 115. The user input point 115 may be identical to the first user input point 108, the second user input point 110, the third user input point 112, and the fourth user input point 114. Sen in FIG. 10 may be an iteration wherein the interface cover 106 may be configured for having four user input points 115, (see FIGS. 1 and 2 for the first user input point 108, the second user input point 110, the third user input point 112, and the fourth user input point 114). FIGS. 9 and 10 illustrate and highlight that the securely linked NFC device 100 may be designed for end user needs in mind and may incorporate any number of NFC chips. FIGS. 9 and 11 further illustrates the use of a housing 188 for protection of securely linked NFC device 100. By way of example only, FIGS. 17 and 18 illustrate the use of nine user inputs, and thus nine NFC chip frequencies.

Further seen in FIGS. 9, 10, and 11 are the interface screen 118, the printed circuit board 126, the first deformable selector 154, the second deformable selector 156, the PCB circuit trace 173, the NFC antenna 174, the first user input location 180, the second user input location 182, the circuit vias 183, the first NFC chip 184, and the second NFC chip 186. In this iteration of securely linked NFC device 100, the interface screen 118 may also correspond with an approximate NFC antenna location 189. Seen in FIG. 11, the membrane stack 102 formation of building the securely linked NFC device 100 may be maintained in all iterations of securely linked NFC device 100. Membrane stack 102 may be maintained in all cases regardless of final number of NFC chips used. Importantly, and by implication, FIG. 10 implies the use of all components necessary to create a four-point user interface which can direct and control four separate NFC chips.

Seen in FIGS. 12, 13, 14, 15, and 16 are further iterations of the form of the securely linked NFC device 100 only. By altering the form factor of the securely linked NFC device 100, the securely linked NFC device 100 may be coupled to a smartphone 300. As can be seen, the approximate NFC antenna location 189 may be placed in an advantageous location with respect to the smartphone 300. The NFC antenna 174 (as seen in FIG. 11) of securely linked NFC device 100 may connect with the smartphone 300 and may aid in boosting signal from the NFC antenna 174 of the securely linked NFC device 100 by way of use of the smartphone 300 power source (not shown). The approximate NFC antenna location 189 may be placed in a location such that the NFC antenna 174 (as seen in FIG. 11) it is adjacent to the smartphone 300. The fundamentals of construction may remain as described in the preceding figures.

FIGS. 17 and 18 are examples for the underlying principle that the securely linked NFC device 100 may be configured with any number of selectable NFC chips and said configuration may be dependent on end user needs. Seen are a one or more than one user input location 190, a one or more than one NFC insertion location 192, a one or more than one NFC chip 194, and a one or more than one deformable selector 196. The user input location 190 may constitute a component which is equivalent to a circuit vias 183 but specifically intended to support end user inputs and may correspond with user input locations (as seen in FIG. 1). The one or more than one deformable selector 196 may complete a circuit between an NFC chip 194 and the NFC antenna 174 thereby activating only that NFC chip 194 which has been selected by a user by way of physically depressing the one or more than one deformable selector 196 and may be selectively coupled therein. Said another way, the one or more than one deformable selector 196 may complete a mechanical connection with the underlying one or more than one user input location 190 of the printed circuit board 126 therein causing and establishing electrical continuity and thus selective coupling, between the selected NFC chip 194 and the NFC antenna 174.

Seen in FIGS. 19 and 20 are components of deformable selector 196. Seen are a deformable member 198, a tactile grip pad 200, mounting notch 202, selector contact point 204, printed circuit board contact point 206, and an engagement action seen as an engaged configuration 208. The deformable member 198 may be continuous and be configured to function as a membrane. The functionality of the engaged configuration 208 may consist of a user of securely linked NFC device 100 applying downward pressure with an appendage onto deformable selector 196 as seen in FIG. 20. The selector contact point 204 may be constructed from non-metallic and conductive materials. The printed circuit board contact point 206 may likewise be constructed of non-metallic and conductive materials.

Alternatively seen in FIG. 19 is a nondepressed configuration, or alternatively stated, a disengaged configuration, or alternatively stated a neutral state. The neural, disengaged configuration may be the default state, as the deformable member 198 may be reflexively biased toward the disengaged configuration. The configuration as seen in FIG. 19 would result in the securely linked NFC device 100 being non-conductive and unable to communicate information to a receiver. Seen in FIG. 20 is a depressed configuration, or alternatively stated, an engaged configuration 208. The engaged configuration 208 as seen in FIG. 20 would result in the securely linked NFC device 100 being conductive and thus able to communicate information to a receiver.

Still referring to FIGS. 19 and 20, the deformable selector 196 may be considered a switch. Said deformable selector 196 may vary in shape, size, material, and function. Accordingly, through trial and error, non-metallic type deformable selector 196 may have been shown to be preferrable to this disclosure. High internal resistance and electromagnetic interference from common switch materials may have the tendency to produce faulty results. It is generally understood that non-metallic switches may have a lower internal resistance and a near zero effect on surrounding electromagnetic interference. Moreover, given some design constraints, a thin profile switch may be further preferred. As such, the selector contact point 204 of the deformable selector 196 may be comprised of carbon or a type of conductive carbon composite, or other non-metallic and conductive material. Further, the deformable member 198 may be configured as an elastic membrane where rebound is achieved. The deformable member 198 may be comprised of silicone, rubber, nylon, polyester(s), or other elastic membrane type configurations wherein both elasticity and continuity are achieved.

Seen in FIG. 21 is a schematic diagram of a PCB circuit trace 173 including approximate NFC antenna location 189. Illustrated is the user input location 190 and NFC insertion location 192, in this example here illustrated, there are three user input location 190 and three NFC insertion locations 192. Any number of user input location 190 and NFC insertion location 192 are contemplated in this disclosure. Further seen is variable circuit trace geometry 210.

Still referring to FIG. 21, one parameter for consideration in this disclosure may be a determination of antenna impedance. Antenna impedance may be defined as a determination of how effectively an NFC antenna 174 (for example, as seen in FIGS. 8 and 9) can transfer and receive power via electromagnetic waves from inception to reception; in other words, a measure of an antennas ability to transfer information between points. Each NFC chip may have a predefined impedance which may be defined by manufacturer specification's operating frequency. In addition to the operating frequency of a given NFC chip, impedance calculations may be further impacted by the physical geometry of an antenna, the material of an antenna, and environment. To account for impedance variance, there may be one or more than one variable circuit trace geometry 210. This is well illustrated when viewing FIGS. 17-18, and 21. Seen are various circuit trace geometries 210 to account for impedance variance. Said variable circuit trace geometry 210 will vary depending on other variables impacting the impedance of a given NFC chip 194 as it may interact with NFC antenna 174. For example, it may be advantageous for the measured impedance for the NFC antenna 174 be the same or similar for each NFC chip 194 applied to this disclosure due to each NFC chip 194 sharing the NFC antenna 174. By using differing circuit trace geometry 210, the securely linked NFC device 100 may be able to balance one or more than one NFC chip 194 with a single NFC antenna 174. By balancing impedance between NFC chips 194 and an NFC antenna 174, a signal lacking interference may be generated. Moreover, because the impedance may be balanced, when the deformable selector 196 (for example, as seen in FIG. 19-20) is in an engaged configuration 208, all components which may be associated with the deformable selector 196 may then become part of generating an electric field, and thus becomes a part of the NFC antenna 174.

When referring to variable circuit trace geometry 210 as it may relate to the PCB circuit trace 173, as actions are performed on securely linked NFC device 100, different circuit paths of the PCB circuit trace 173 may be available for signal conduction and others may not be available. By way of example, in viewing FIG. 17, different circuit paths can close or opened depending on which NFC chip 194 becomes activated. The differing paths taken may ensure that the impedance is balanced between the NFC antenna 174 and the NFC chip 194, as seen in FIG. 18. This is viewed in a simplified format in FIG. 20, where variable circuit trace geometry 210 is easily understood.

Now referring to FIGS. 1-21, seen are various subcomponents of the securely linked NFC device 100. Each of the subcomponents can be modified, with the modification not impacting the overall scope of the securely linked NFC device 100. Some of the securely linked NFC devices 100 may be designed with 5 (five) NFC chips 194 while others may be designed with 10 (ten). The securely linked NFC device 100 may function identically with any number of NFC chips 194. As the NFC chip 194 are increased in number, so may ancillary components to harmonize the total functionality of the securely linked NFC device 100. The NFC antenna 174 may not increase in number as NFC chip 194 are increased.

When referring to a deformable selector in this disclosure, either the deformable selector will be numerically identified, or the deformable selectors will be named generally. When named generally, the deformable selector 196 will be identified. It may be useful for this disclosure to also name a first deformable selector 154, or a second deformable selector 156, or a third deformable selector 158, or a fourth deformable selector 160, etc., for purposes of explanation and description only. However, the term deformable selector 196 is interchangeable with the items identified as a first deformable selector 154, a second deformable selector 156, a third deformable selector 158, and a fourth deformable selector 160, etc.

When referring to an NFC chip/s in this disclosure, either an NFC chip will be numerically identified, or an NFC chip will be named generally. When named generally, the NFC chip 194 will be identified. It may be useful for this disclosure to also name a first NFC chip 184 or a second NFC chip 186, etc., for purposes of explanation and description only. However, the NFC chip 194 is interchangeable with the items identified as a first NFC chip 184 and a second NFC chip 186, etc.

Having disclosed the structure of the preferred embodiments, it is now possible to describe its function, operation, and use. The securely linked NFC device 100 may provide securely linked security measures due to the ability of the user of the securely linked NFC device 100 to leave any specific NFC frequency in an inactive state when not desired for instant use. Moreover, the user of securely linked NFC device 100 may hold numerous NFC frequencies on the securely linked NFC device 100. By way of example, the securely linked NFC device 100 may hold credit card information, debit card information, entry way access frequencies, any other device activated by NFC frequencies.

The interface cover 106 may be constructed of many different materials, both natural and synthetic (by way of example only, carbon fiber, leather, plastic, wood, wood fiber, cellulose fiber, resin, or other surfaceable and semi-elastic material, surfaceable meaning a material surface which can be rendered smooth to the touch). The housing 188 of the securely linked NFC device 100 may envelop the membrane stack 102.

The NFC chip 194 described here may be capable of data migration. The NFC chip 194 may be erasable, writable, and rewritable. Further, and where multiple NFC chips 194 are involved, a collection of NFC chips 194 may be configured for commercialization purposes, wherein a corporation may utilize security measures to prevent one NFC chip 194 of the collection of NFC chips 194 from being rewritten. The NFC chip 194 may also be capable of passive activation, thus there may not be a need for battery in the securely linked NFC device 100. The NFC chip 194 of the securely linked NFC device 100 may be activated by passive means, wherein the NFC antenna 174 may be powered by local magnetic fields. The NFC chip 194 disclosed herein may be single-interface type or dual-interface type, dependent on end user needs.

Use of the securely linked NFC device 100 may be mechanical in nature. The printed circuit board 126 of the securely linked NFC device 100 may contain a number of circuit vias 183 along the PCB circuit trace 173 which may require closure of electrical connectivity for operation, wherein the closure of electrical connectively may be achieved by an end user selecting a specific NFC chip 194 by use of the physical deformable selector 196. When the deformable selector 196 is deformed, it may also be said to be engaged, depressed, or activated by an end user, at which point a specifically selected NFC chip 194 may be electrically and selectively coupled to the NFC antenna 174 of securely linked NFC device 100. In this manner, all other NFC chip 194 which are not presently requested by the end user will be in a non-activated state. Further in this manner, only the selected NFC chip 194 may be in an active state when selected. When user is no longer needing said NFC chip 194, the end user may release the deformable selector 196 which may then mechanically rebound and resume its prior non-deformed state and thus make the previously active NFC chip 194 non-activated. Said non-activation may arise from lack of electrical continuity. When the deformable selector 196 is deformed, the circuit may be closed and selectively coupled. When the deformable selector 196 is not deformed, the circuit may be open and not selectively coupled.

In consideration for the placement of the first user input point 108, the second user input point 110, the third user input point 112, the fourth user input point 114, the power indicator lights 116, the interface screen 118, the first adhesive layer aperture 132, the second adhesive layer aperture 134, the third adhesive layer aperture 136, the fourth adhesive layer aperture 138, the first deformable selector alignment aperture 142, the second deformable selector alignment aperture 144, the third deformable selector alignment aperture 146, the fourth deformable selector alignment aperture 148, the alignment depression 150, the first deformable selector 154, the second deformable selector 156, the third deformable selector 158, the fourth deformable selector 160, and the alignment aperture 164, may be placed anywhere in the membrane stack 102 provided that said elements of each portion align. By way of example, said first user input point 108 may be placed anywhere on the interface cover 106 provided that other components necessary to the function of first user input point 108 align with the first user input point 108. For this example, only, the first user input point 108 may align with the first adhesive layer aperture 132, which may align with the first deformable selector alignment aperture 142, which may align with the first deformable selector 154, which may align with the first retention space 166. Additionally, there may be any number of user input points, this disclosure is in no way limited to a total of two (2), four (4), or nine (9) user input points, with the total number of NFC chip 194 being equal to the number of user input points.

As seen in FIGS. 1-21, the securely linked NFC device 100 may comprise an interface cover 106 and a printed circuit board 126. The interface cover 106 may have a one or more than one user input point 115 and interface screen 118. The printed circuit board 126 may have a PCB circuit trace 173, an NFC antenna 174, a one or more than one circuit vias 183, a one or more than one user input location 190, and a one or more than one deformable selector 196, wherein the one or more than one deformable selector 196 may be conductive. The securely linked NFC device 100 may further comprise a one or more than one NFC insertion location 192 which may have a one or more than one NFC chip 194, the one or more than one NFC chip 194 may be powered passively and may be re-writable. Re-writable in this context may carry an understanding of data writing and erasing on a machine-readable medium. The one or more than one NFC chip 194 and the one or more than one NFC insertion location 192 may be disposable to any location on the printed circuit board 126. The PCB circuit trace 173 may further have a variable circuit trace geometry 210. The variable circuit trace geometry 210 may result in balancing an electrical impedance between the NFC antenna 174 and the one or more than one NFC chip 194 when the one or more than one deformable selector 196 is in an engaged configuration.

Further, the interface cover 106 may have a one or more than one power indicator lights 116 and in combination with the printed circuit board 126 may be held together by a housing 188 and bottom plate 130. Additionally, the interface cover 106 may be adhered to the printed circuit board 126 by application of an adhesive to the interface cover 106. Additionally, the interface cover 106 may be adhered to the printed circuit board 126 with an adhesive layer 120. Additionally, the one or more than one deformable selector 196 may be mechanically deformable between an engaged and a disengaged configuration. The deformable selector 196 may utilize a non-metallic contact.

Further, the PCB circuit trace 173 may be conductive and may be coupled to the NFC antenna 174. The one or more than one deformable selector 196 may have a depressed configuration and a nondepressed configuration, the depressed configuration may cause for established selective conductive continuity between the PCB circuit trace 173 and the NFC antenna 174. Additionally, the printed circuit board 126 may further have a connector pin housing 103, a PCB connector pinout 104, and a PCB cable connection 105.

As seen in FIGS. 1-21, the securely linked NFC device 100 may comprise an interface cover 106 and a printed circuit board 126. The interface cover 106 may be configured for a one or more than one user input point 115 and an interface screen 118. The printed circuit board 126 may have a PCB circuit trace 173, an NFC antenna 174, a one or more than one circuit vias 183, a one or more than one user input location 190, and a one or more than one deformable selector 196. Additionally, the PCB circuit trace 173 and deformable selector 196 may be conductive (electrically) and selectively coupled to the NFC antenna 174. Selectively may refer to an end user being able to select one NFC chip 194 from many. Further, the one or more than one deformable selector 196 may be mechanically deformable between an engaged configuration and a disengaged configuration and therein establishing selective conductive continuity between the PCB circuit trace 173 and the NFC antenna 174 when in the engaged configuration. Engaged may further refer to a closed electrical circuit, while disengaged may refer to an open electrical circuit. Further, the securely linked NFC device 100 may have a one or more than one NFC insertion location 192 which may have a one or more than one NFC chip 194. The one or more than one NFC chip 194 may be powered passively and may be re-writable. Additionally, the one or more than one NFC chip 194 and the one or more than one NFC insertion location 192 may be disposable to any location on the printed circuit board 126. The PCB circuit trace 173 may have a variable circuit trace geometry 210. The variable circuit trace geometry 210 may balance an electrical impedance between the NFC antenna 174 and the one or more than one NFC chip 194 when the deformable selector 196 is in the engaged configuration. The deformable selector 196 may utilize a non-metallic contact point.

Further the interface cover 106 and the printed circuit board 126 may be held together by a housing 188. Additionally, the interface cover 106 may be adhered to the printed circuit board 126 by application of an adhesive to the interface cover 106. Alternatively, the interface cover 106 may be adhered to the printed circuit board 126 with an adhesive layer 120. Additionally, the interface cover 106 may have a one or more than one power indicator lights 116 for status indication. Said status indication may refer to informational signals to an end user to show the mode of operation of the securely linked NFC device 100 at any given point in time. Additionally, the printed circuit board 126 may further have a connector pin housing 103, a PCB connector pinout 104, and a PCB cable connection 105.

As seen in FIGS. 1-21, the securely linked NFC device 100 may comprise a printed circuit board 126 which may have a single NFC antenna 174, a one or more than one circuit vias 183, a PCB circuit trace 173, a more than one NFC insertion location 192, and a more than one user input location 190. Each of the more than one NFC insertion location 192 may be configured to receive a respective single NFC chip 194 and each of the more than one user input location 190 may be configured to receive a respective single deformable selector 196. Additionally, each of the respective single deformable selector 196 may be mechanically deformable between an engaged configuration and a disengaged configuration. Further, the engaged configuration may aid in causing, or establishing, electrical continuity between the single NFC antenna 174 and the respective single NFC chip 194 therein. Further, the engaged configuration may be passively activating the respective single NFC chip 194 to an exclusion of all other of the respective single NFC chip 194 then in the disengaged configuration. Further, the securely linked NFC device 100 may have a variable circuit trace geometry 210 causing for a balanced impedance between the NFC chip 194 and the NFC antenna 174 therein.

Further an interface cover 106 may be adhered to the printed circuit board 126. The interface cover 106 may further have more than one user input points 115. The interface cover 106 and the printed circuit board 126 may be further adhered to a bottom plate 130. Alternatively, the interface cover 106 and the printed circuit board 126 may be enveloped by a housing 188. Additionally, the printed circuit board 126 may further have a connector pin housing 103, a PCB connector pinout 104, and a PCB cable connection 105. The deformable selector 196 may utilize non-metallic contact points.

While embodiments of the present disclosure have been illustrated and described, it is not intended that these embodiments illustrate and describe all possible forms of this disclosure. Rather, the words used in the specification are words of description rather than limitation, and it is understood that various changes may be made without departing from the spirit and scope of the disclosure.

Accordingly, it is not intended that the various embodiments be limited except by the appended claims. Insofar as the description above and the accompanying drawings disclose any additional subject matter that is not within the scope of the claims below, the embodiments are not dedicated to the public and the right to file one or more applications to claim such additional embodiments is reserved.

What is claimed is:

1. A securely linked NFC device comprising;
an interface cover and a printed circuit board;
the interface cover having a one or more than one user input point and an interface screen;
the printed circuit board having a PCB circuit trace, an NFC antenna, a one or more than one circuit vias, a one or more than one user input location, and a one or more than one deformable selector, the one or more than one deformable selector configured for conductive communication with the PCB circuit trace; and
a one or more than one NFC insertion location having a one or more than one NFC chip, the one or more than one NFC chip being disposable to any location on the printed circuit board.

2. The securely linked NFC device of claim 1, wherein the one or more than one NFC insertion location and the one or more than one NFC chip being powered passively and re-writable.

3. The securely linked NFC device of claim 1, wherein the interface cover is adhered to the printed circuit board by application of an adhesive to the interface cover.

4. The securely linked NFC device of claim 1, wherein there is only the one NFC antenna.

5. The securely linked NFC device of claim 1, wherein the one or more than one deformable selector is mechanically deformable between an engaged configuration and a disengaged configuration;
the engaged configuration further causing a selective conductive continuity between the PCB circuit trace and the NFC antenna.

6. The securely linked NFC device of claim 1, wherein the PCB circuit trace has a variable circuit trace geometry;
the variable circuit trace geometry therein balancing an electrical impedance between the NFC antenna and the one or more than one NFC chip when the one or more than one deformable selector is in an engaged configuration.

7. The securely linked NFC device of claim 6, wherein the one or more than one deformable selector further comprises a non-metallic electrical contact.

8. A securely linked NFC device comprising;
an interface cover and a printed circuit board;
the interface cover configured for a one or more than one user input point and an interface screen;
the printed circuit board further having a PCB circuit trace, an NFC antenna, a one or more than one circuit vias, a one or more than one user input location, and a one or more than one deformable selector, the PCB circuit trace and deformable selector being conductive and selectively coupled to the NFC antenna, the one or more than one deformable selector being mechanically deformable between an engaged configuration and a disengaged configuration;
the engaged configuration therein causing a selective conductive continuity between the PCB circuit trace and the NFC antenna; and
a one or more than one NFC insertion location having a one or more than one NFC chip, the one or more than one NFC chip powered passively and being re-writable.

9. The securely linked NFC device of claim 8, wherein there is only the one NFC antenna.

10. The securely linked NFC device of claim 8, wherein the deformable selector further comprises a non-metallic electrical contact.

11. The securely linked NFC device of claim 8, wherein the PCB circuit trace has a variable circuit trace geometry;
the variable circuit trace geometry therein balancing an electrical impedance between the NFC antenna and the one or more than one NFC chip when the deformable selector is in the engaged configuration.

12. The securely linked NFC device of claim 8, wherein the interface cover has a one or more than one power indicator lights for status indication.

13. The securely linked NFC device of claim 8, wherein the printed circuit board further has a connector pin housing, a PCB connector pinout, and a PCB cable connection.

14. A securely linked NFC device comprising;
a printed circuit board having a single NFC antenna, a one circuit vias, a PCB circuit trace, an NFC insertion location, and a user input location;
each of the NFC insertion location configured to receive an NFC chip and the user input location configured to receive a deformable selector,
each of the deformable selector being mechanically deformable between an engaged configuration and a disengaged configuration, the engaged configuration establishing electrical continuity between the single NFC antenna and the NFC chip therein;
a variable circuit trace geometry causing for a balanced impedance between the NFC chip and the NFC antenna therein; and
the engaged configuration passively activating one of the NFC chip.

15. The securely linked NFC device of claim 14, wherein an interface cover is adhered to the printed circuit board; the interface cover further having a more than one user input points.

16. The securely linked NFC device of claim 15, wherein the interface cover, the printed circuit board, are further adhered to a bottom plate.

17. The securely linked NFC device of claim 15, wherein the interface cover and the printed circuit board are enveloped by a housing.

18. The securely linked NFC device of claim 14, wherein the printed circuit board further has a connector pin housing, a PCB connector pinout, and a PCB cable connection.

19. The securely linked NFC device of claim 14, wherein the deformable selector further comprises a non-metallic electrical contact.

* * * * *